(12) United States Patent
Lee et al.

(10) Patent No.: US 6,651,325 B2
(45) Date of Patent: Nov. 25, 2003

(54) METHOD FOR FORMING CANTILEVER BEAM PROBE CARD AND PROBE CARD FORMED

(75) Inventors: Cheng-Hong Lee, Shinjuang (TW); Hsin-Li Lee, Hsinchu (TW); Yi-Shiau Chen, Yunlin (TW)

(73) Assignee: Industrial Technologies Research Institute, Hsin Chu (TW)

( * ) Notice: Subject to any disclaimer, the term of this patent is extended or adjusted under 35 U.S.C. 154(b) by 0 days.

(21) Appl. No.: 10/079,748

(22) Filed: Feb. 19, 2002

(65) Prior Publication Data
US 2003/0155940 A1 Aug. 21, 2003

(51) Int. Cl.⁷ ................................................. H05K 3/10
(52) U.S. Cl. .............................. 29/846; 29/825; 29/847; 324/762
(58) Field of Search .......................... 29/832, 825, 846, 29/847; 324/762

(56) References Cited

U.S. PATENT DOCUMENTS 6,232,669 B1 * 5/2001 Khoury et al.
6,307,392 B1 * 10/2001 Soejima et al.
6,466,043 B2 * 10/2002 Khoury et al.

OTHER PUBLICATIONS

A Novel ME<S Silicon Probe Card by Bong–Hwan et al, , Fifteenth IEEE International Conference on Micro Electric Mechanica Systems, held Jan Jan. 20–24, 2002 pp 369–71.*

* cited by examiner

Primary Examiner—Carl J. Arbes
(74) Attorney, Agent, or Firm—Tung & Associates

(57) ABSTRACT

A method for forming a cantilever beam probe card on a semiconducting substrate and the probe card fabricated by such method are described. The method utilizes the deposition of two separate metal layers of different metals for forming a cantilever beam and a microprobe for use as a probe needle. A sacrificial, insulating material layer such as oxide or nitride is utilized in-between the metal layers and a semiconducting substrate and is subsequently removed such that the cantilever beams are released from the semiconducting substrate except at a support portion. The present invention cantilever beam probe card formed by the method can be used to probe testing IC devices that have high pin count and fine pitch.

13 Claims, 3 Drawing Sheets

METHOD FOR FORMING CANTILEVER BEAM PROBE CARD AND PROBE CARD FORMED

FIELD OF THE INVENTION

The present invention generally relates to a semiconductor fabrication method and system and more particularly, relates to a method for forming cantilever beam probe card and the probe card formed.

BACKGROUND OF THE INVENTION

As semiconductor integrated circuits continue to be dramatically reduced in size, the trend in electronic manufacturing has been toward increasingly smaller geometries particularly in integrated circuit technology in which a very large number of discrete circuit elements are fabricated on a single substrate or "wafer". After fabrication, the wafer is divided into a number of rectangular-shaped chips or "dice" where each die presents a rectangular or other regular arrangement of metallized contact pads through which input/output connections are made. Although each die is eventually packaged separately, for efficiency sake, testing of the circuit formed on each die is preferably performed while the dies are still joined together on the wafer. One typical procedure is to support the wafer on a flat stage or "chuck" and to move the wafer in X, Y and Z directions relative to the head of the probing assembly so that the contacts on the probing assembly move from die to die for consecutive engagement with each die. Respective signal, power and ground lines are run to the probing assembly from the test instrumentation thus enabling each circuit to be sequentially connected to the test instrumentation.

One conventional type of probing assembly used for testing integrated circuits provides contacts that are configured as needle-like tips. These tips are mounted about a central opening formed in a probe card so as to radially converge inwardly and downwardly through the opening. When the wafer is raised beyond that point where the pads on the wafer first come into contact with these tips, the tips flex upwardly so as to skate forwardly across their respective pads thereby removing oxide buildup on the pads.

The problem with this type of probing assembly is that the needle-like tips, due to their narrow geometry, exhibit high inductance so that signal distortion is large in high frequency measurements made through these tips. Also, these tips can act in the manner of a planing tool as they wipe across their respective pads, thereby leading to excessive pad damage. This problem is magnified to the extent that the probe tips bend out of shape during use or otherwise fail to terminate in a common plane which causes the more forward ones of the tips to bear down too heavily on their respective pads.

Thus, in the course of testing semiconductor devices and circuits it becomes necessary to contact and electrically probe the devices and circuits to ascertain their function and determine failure mechanisms. To accomplish this, a finely pointed probe tip or group of finely pointed probe tips is brought into contact with the device or circuit by using pads connected to the device or circuit. As semiconductor devices become smaller and circuits denser, it becomes difficult to make electrical contact with the device with conventional probes, as the probe tips are either too large or too blunt to selectively contact only the intended device or circuit because they have a propensity to contact adjacent structures. Or, the tips are so thin as to bend when contact is attempted and slide off the probe terminal target circuit being tested. When multiple probes are required, it is often not possible to bring the correct number of probe tips close enough to each other because the size of the bodies will physically interfere with one another or will block the view of the target area being tested, thereby making alignment difficult or impossible.

As a result of these problems, pads on semiconductor devices which can number several hundred are often limited by the probe assemblies or probe rings used because of the size of the probe tips. This is especially true in the street or kerf regions between active dies on semiconductor wafers, wherein special test and process monitoring devices and circuits are often fabricated. The actual devices and monitoring structures are often very much smaller than the pads connected to them. A more compact probe assembly would allow smaller pads to be used allowing more devices in the same space or the same number of devices in a smaller space.

The present inventors thus recognize based on the foregoing, that a need exists for an acceptable micro tip that can be utilized with micro probes as semiconductor circuits continue to shrink. Users typically waste a great deal of time and effort attempting to fabricate an acceptable micro tip. To date, a reliable method for fabricating an acceptable micro tip has not been evidenced. The present inventors believe that implementing a micro tip in accordance with the invention described herein can thus solve these problems.

It is therefore an object of the present invention to provide an improved semiconductor manufacturing method and device thereof.

It is another object of the present invention to provide a method for forming a microtip of a microprobe on a probe card.

It is a further object of the present invention to provide a method for forming a microtip of a microprobe by utilizing micromachining manufacturing techniques.

It is another further object of the present invention to provide a method for fabricating a cantilever beam probe card by a micro-electro-mechanical system (MEMS) technology.

It is still another object of the present invention to provide a method for forming a probe card by using a sacrificial layer of oxide to release cantilever beams formed on the card.

It is yet another object of the present invention to provide a method for forming probe card by MEMS technology by forming cantilever beams from two different metals.

It is still another further object of the present invention to provide a method for forming a cantilever beam probe card that can be used for testing high pin count and fine pitch IC devices at low cost.

SUMMARY OF THE INVENTION

In accordance with the present invention, a method for forming a cantilever beam probe card and the probe card formed are disclosed.

In a preferred embodiment, a method for forming a cantilever beam probe card on a semiconducting substrate can be carried out by the operating steps of first providing a semiconducting substrate that has a top surface and a bottom surface; depositing an insulating material layer of at least 0.1 µm thickness on the top surface; patterning and etching at least two via holes in the insulating material layer; depositing a first metal layer of at least 0.15 µm thickness on top of and measured from the semiconducting substrate filling the at least two via holes and covering a top surface of the insulating material layer; depositing a second metal layer of at least 0.1 μm thickness on top of the first metal layer, the second metal layer being formed of a metal different than that used in forming the first metal layer; patterning and etching at least two via holes in the bottom surface of the semiconducting substrate exposing the at least two via holes formed in the insulating material layer; filling the at least two via holes in the semiconducting substrate with a metal forming at least two vias; patterning and etching at least two cone-shaped microprobes from the second metal layer; patterning and etching a trench in the first metal layer electrically insulating the at least two cone-shaped microprobes from each other; and etching away the insulating material layer from the top surface of the semiconducting substrate.

The method for forming a cantilever beam probe card on a semiconducting substrate may further include the step of bonding the at least two vias to a printed circuit board (PCB) or a ceramic substrate through solder bumps formed on the PCB or the ceramic substrate. The method may further include the step of etching away the insulating material layer by a wet etching process, or the step of patterning and etching the trench in the first metal layer by a dry etch or a wet etch process, or the step of patterning and etching the at least two cone-shaped microprobes by a dry etch or a wet etch process. The method may further include the step of filling the at least two via holes in the semiconducting substrate with a metal selected from the group consisting of Cu, Au and Ni, or the step of patterning and etching the at least two via holes in the semiconducting substrate by a dry etching process, or the step of depositing the second metal layer from a metal selected from the group consisting of Cr and Ni to a thickness between about 0.1 μm and about 2 μm. The method may further include the step of depositing the first metal layer from a metal selected from the group consisting of Cu, Al and alloys thereof to a thickness between about 0.1 μm and about 2 μm. The method may further include the step of depositing the insulating material layer from a material selected from the group consisting of silicon oxide, silicon nitride and silicon oxynitride to a thickness between about 0.1 μm and about 2 μm.

The present invention is further directed to a cantilever beam probe card that is formed on a semiconducting substrate which includes a semiconducting substrate; a first plurality of electrically conducting vias formed in the semiconducting substrate; a first plurality of electrically conducting beam supports formed on the semiconducting substrate each electrically connecting to one of the first plurality of vias; a second plurality of electrically conducting cantilever beams each formed on top of and each electrically connecting to one of the first plurality of beam supports; and a third plurality of electrically conducting microprobes each formed on top of and extending upwardly from one of the second plurality of electrically conducting cantilever beams.

In the cantilever beam probe card formed on a semiconducting substrate, the semiconducting substrate may further be bonded to a printed circuit board or a ceramic substrate by bonding the first plurality of electrically conducting vias to a fourth plurality of solder bumps formed on the printed circuit board or on the ceramic substrate. The first plurality of electrically conducting vias may be formed of a metal selected from the group consisting of Cu, Au and Ni. Each of the third plurality of electrically conducting microprobes may be formed in a coneshape with a sharp point pointing away from the cantilever beam. Each of the third plurality of electrically conducting microprobes is formed of a metal selected from the group consisting of Cr and Ni. Each of the second plurality of electrically conducting cantilever beams is formed of a metal selected from the group consisting of Cu, Al and alloys thereof. The second plurality of electrically conducting cantilever beams may be formed of a metal different than the metal that forms the third plurality of electrically conducting microprobes.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

The present invention discloses a method for forming probe cards for semiconductor IC device testing and more particularly, discloses a method for forming a cantilever beam type probe card for use in testing IC devices of high pin count and fine pitch and furthermore, the probe card fabricated by the method.

The method utilizes a sacrificial, insulating material layer that is coated on a semiconducting substrate, such as a silicon wafer. By coating two metal layers of different materials and patterning and forming the cantilever beams and microprobes, the sacrificial, insulating material layer is then removed in a wet etch process to release the cantilever beams on the probe card. The dual-metal layer of the cantilever beam/microprobes enables the beam to form a curvature and thus, advantageous for testing and probing bond pads and solder bumps on an IC device. The dual-metal layer structure of the cantilever beam/microprobe is therefore an important aspect of the present invention in order to allow an intimate contact of the microprobe with the bond pads on the device tested.

Figure 1:
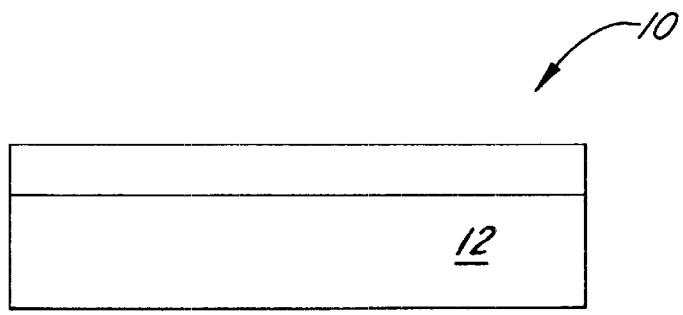
FIG. 1 is an enlarged, cross-sectional view of a semiconducting substrate for the present invention probe card with a sacrificial, insulating material layer deposited on top.
Figure 2:
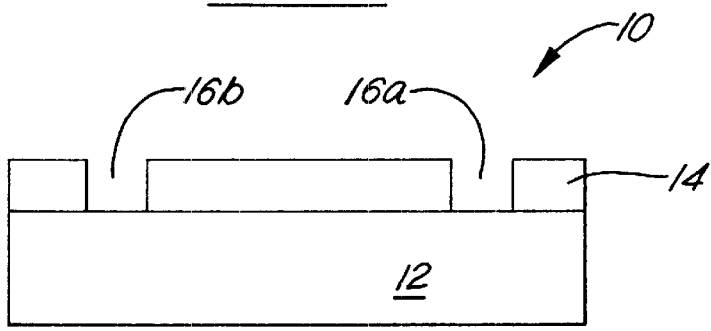
FIG. 2 is an enlarged, cross-sectional view of the present invention semiconducting substrate of FIG. 1 with the sacrificial, insulating material layer patterned and etched.

Referring initially to FIG. 1, wherein a present invention device 10 which includes a semiconducting substrate 12 and a sacrificial, insulating material layer 14 coated on top is shown. The semiconducting substrate 12 may be a silicon wafer or formed of any other semiconducting materials. The insulating material layer 14, or the sacrificial layer since it will be removed at the completion of the probe card, may be suitably deposited of a material such as silicon oxide, silicon nitride or silicon oxynitride. A suitable thickness of the sacrificial, insulating material layer 14 may be between about 0.1 $\mu$m and about 2 $\mu$m. The word "about" used in this writing indicates a range of values that is ±10% of the average value given.

Figure 3:
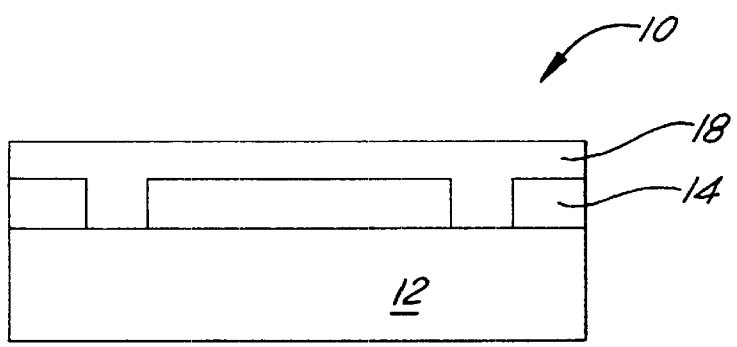
FIG. 3 is an enlarged, cross-sectional view of the present invention semiconducting substrate of FIG. 2 with a first metal deposited to fill the via holes and to cover the top of the insulating material layer.
Figure 4:
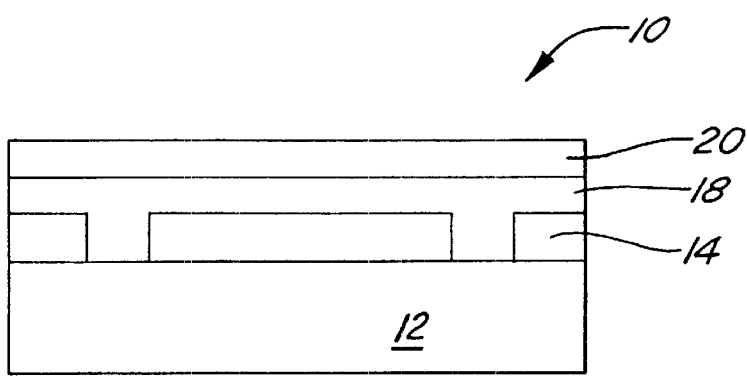
FIG. 4 is an enlarged, cross-sectional view of the present invention semiconducting substrate of FIG. 3 with a second metal layer deposited on top of the first metal layer.
Figure 5:
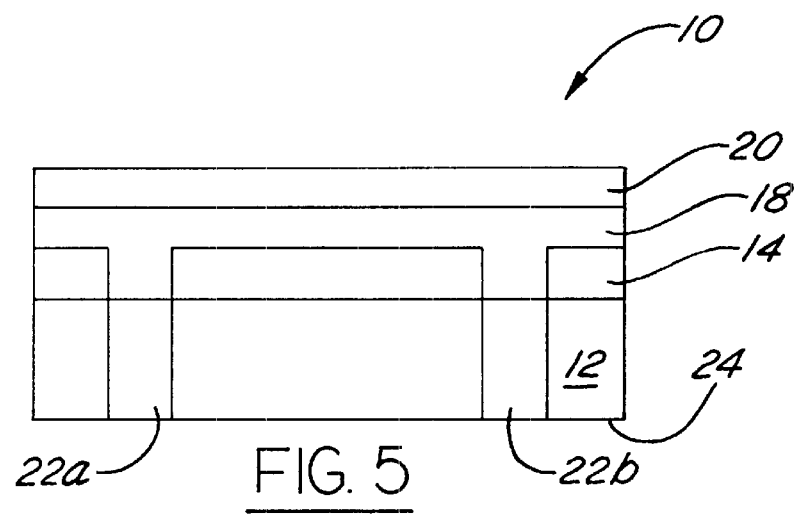
FIG. 5 is an enlarged, cross-sectional view of the present invention semiconducting substrate of FIG. 4 with via holes formed in the bottom surface of the substrate to expose the via holes formed in the insulating material layer.

In the next step of the process, the sacrificial, insulating material layer 14 is patterned and etched, most likely by a dry etching process, to form via holes 16a and 16b and on top of the sacrificial, insulating material layer 14, is then deposited a first metal layer 18, as shown in FIG. 3. The first metal layer 18 may be suitably formed of a material such as Cu, Al or an AlCu alloy. The first metal layer may be deposited to a thickness between about 0.1 $\mu$m and about 2 $\mu$m. It should be noted that the first metal layer 18 that is deposited on top of the first insulating material layer should have a minimum thickness of at least 0.1 $\mu$m such that the cantilever beam formed at a later stage has a minimum thickness and a minimum strength for functioning as a probe needle arm.

A second metal layer 20 which is advantageously a metal different than that used in depositing the first metal layer 18, is then deposited on top of the first metal layer 18. It should be noted that both the first metal layer 18 and the second metal layer 20 may be deposited by a number of suitable techniques including sputtering. When the first metal layer deposited is formed of Cu, Al or AlCu, the second metal layer 20 may be suitably deposited of a material such as Cr and Ni. The different metal materials used in forming a dual-metal structure of cantilever beam/microprobe enables the present invention probe card to function properly by curving the cantilever arm after the sacrificial, insulating material layer is removed at the end of the process.

At least a pair of through holes 22a and 22b are then formed photolithographically and by dry etching such as an ICP (inductively coupled plasma) process. The via holes 22a and 22b are formed to expose the via holes 16a and 16b, previously formed. The via holes 22a and 22b formed in the bottom surface 24 of the semiconducting substrate 12 are then filled with a conductive metal such as Cu, Au or Ni. A suitable process for filling the metal in the deep via holes is by electroplating. Vias 26a and 26b thus formed establish electrical connection with the vias formed previously in the via holes 16a and 16b. This is shown in FIG. 6.

Figure 6:
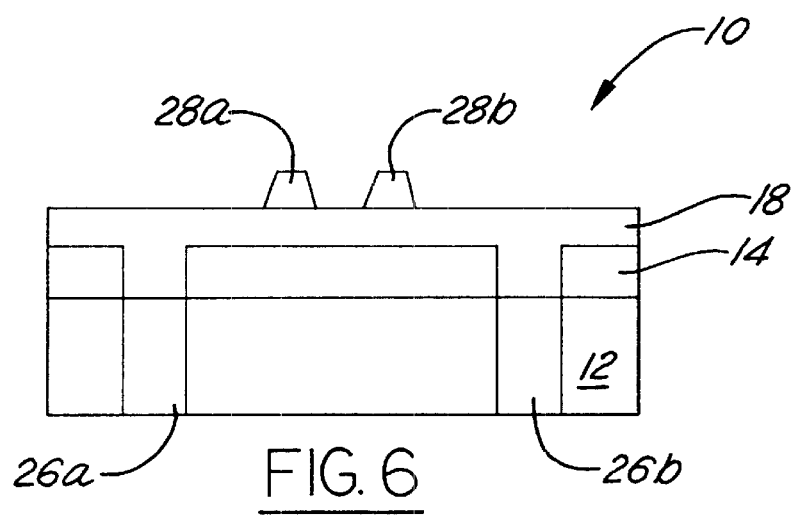
FIG. 6 is an enlarged, cross-sectional view of the present invention semiconducting substrate of FIG. 5 with the microprobes formed from the second metal layer.

Also shown in FIG. 6 is the formation of a pair of microprobes 28a and 28b from the second metal layer 20. This can be carried out photolithographically by either a dry etch or a wet etch process. It should be noted that the microprobes 28a and 28b are formed desirably in a cone-shape with a sharp tip at the top and a large base at the bottom. The sharp tip 30 is used to contact bond pads or solder bumps in a subsequent testing process when the probe card 10 is utilized. The chemistry of the dry etch or wet etch for forming the microprobes 28a and 28b depends on the material of the second metal layer 20.

Figure 7:
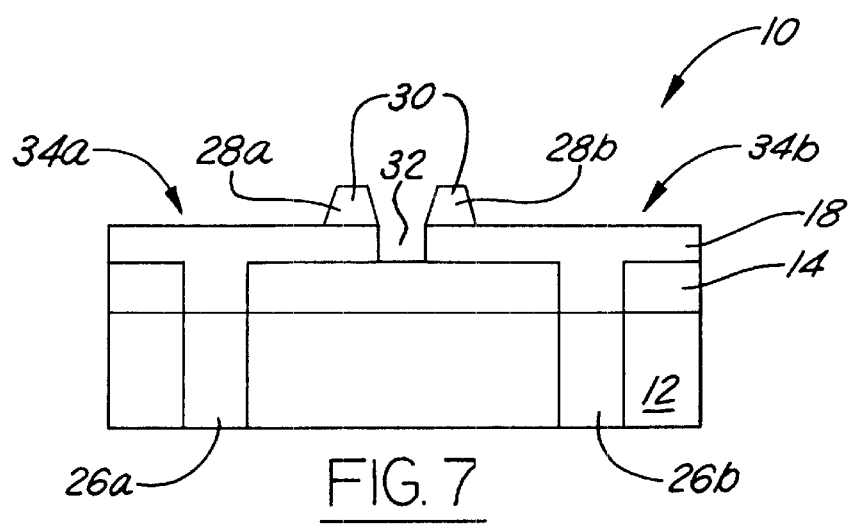
FIG. 7 is an enlarged, cross-sectional view of the present invention semiconducting substrate of FIG. 6 with a trench formed in the first metal layer to electrically insulate the two microprobes.

In the next step of the process, as shown in FIG. 7, a trench 32 is photolithographically formed and etched in the first metal layer 18 to electrically separate and insulate the microprobes 28a and 28b, i.e. by separating the cantilever beams 34a and 34b. The trench 32 formed should have an adequate width such that the microprobes 28a and 28b can be completely separated. The probe card 10 can then be completed, by the process shown in FIG. 8, by removing the sacrificial, insulating material layer 14 from the top of the semiconducting substrate 12. An effective removal process is by wet etch wherein a suitable etchant may be used to etch away the insulating material layer 14.

Figure 8:
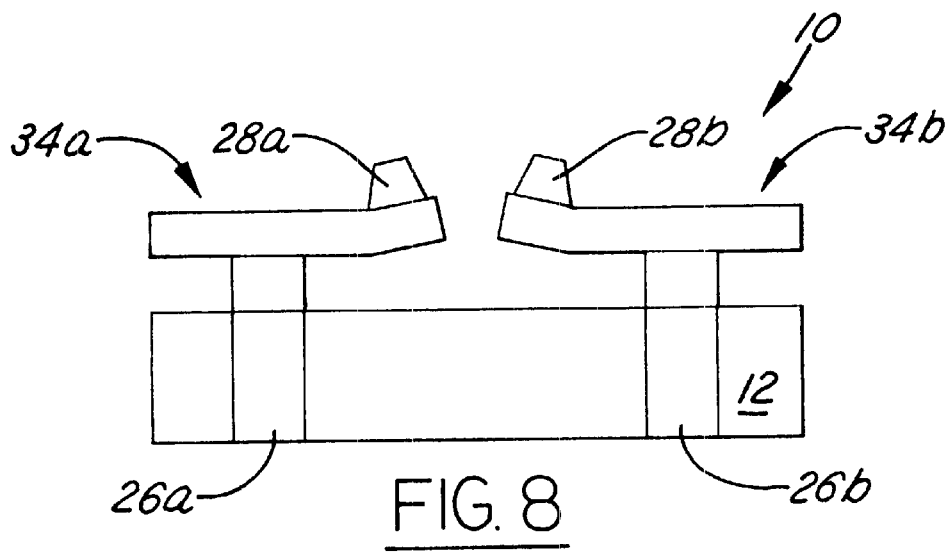
FIG. 8 is an enlarged, cross-sectional view of the present invention semiconducting substrate of FIG. 7 with the sacrificial, insulating material layer removed.

As shown in FIG. 8, after the sacrificial, insulating material layer 14 is removed by the wet etchant, the end of the cantilever beam 34a and 34b that has the microprobes 28a and 28b formed thereon, curves upwardly away from the semiconducting substrate 12. The curvature is formed due to the dual-metal structure, i.e. or commonly known as a bimorph structure, of the cantilever beam/microprobe structure. For instance, as previously described, when the cantilever beams 34a and 34b are formed of Cu, Al or AlCu alloys, the microprobes 28a and 28b are formed of Cr or Ni. The probe card 10 is thus completed and can be used for testing an IC device by touching the microprobes 28a, 28b with bond pads on the device (not shown). The degree of curvature of the cantilever beams 34a, 34b depends on the types of the metal materials used in forming the beam and the microprobes 28a and 28b. Any suitable combination can be selected to produce the desirable curvature.

Figure 9:
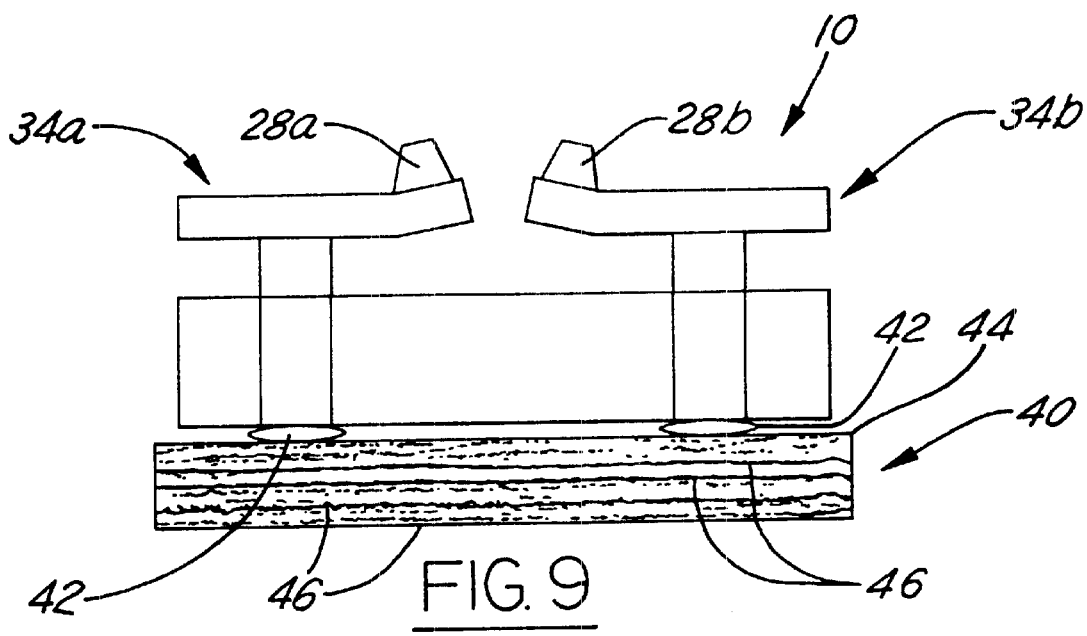
FIG. 9 is an enlarged, cross-sectional view of an alternate embodiment of the invention, wherein the semiconducting substrate is bonded to a printed circuit board by solder bumps.

In an alternate embodiment, shown in FIG. 9, the probe card 10 is further mounted to a PCB board 40 by a plurality of solder bumps 42 formed on the surface 44 of the PCB board 40. This provides an easy connection of the probe card 10 with the outside circuit since the PCB board 40 is prepared with layers of conductive traces 46, as shown in FIG. 9. The alternate embodiment of the probe card 10 mounted on the PCB board 40 (or equivalently a ceramic substrate with conductive traces molded in) provides a more versatile probe card for testing applications.

The present invention novel method for forming a cantilever beam probe card and the probe card fabricated by the method have therefore been amply described in the above description and in the appended drawings of FIGS. 1–9.

While the present invention has been described in an illustrative manner, it should be understood that the terminology used is intended to be in a nature of words of description rather than of limitation.

Furthermore, while the present invention has been described in terms of a preferred and an alternate embodiment, it is to be appreciated that those skilled in the art will readily apply these teachings to other possible variations of the inventions.

The embodiment of the invention in which an exclusive property or privilege is claimed are defined as follows:

What is claimed is:

1. A method for forming a cantilever beam probe card on a semiconducting substrate comprising the steps of:

providing a semiconducting substrate having a top surface and a bottom surface;

depositing an insulating material layer of at least 0.1 $\mu$m thickness on said top surface;

patterning and etching at least two via holes in said insulating material layer;

depositing a first metal layer of at least 0.15 $\mu$m thickness on top of and measured from said semiconducting substrate filling said at least two via holes and covering a top surface of said insulating material layer;

depositing a second metal layer of at least 0.1 µm thickness on top of said first metal layer, said second metal layer being formed of a metal different than said first metal layer;

patterning and etching at least two via holes in said bottom surface of said semiconducting substrate exposing said at least two via holes formed in said insulating material layer;

filling said at least two via holes in said semiconducting substrate with a metal forming at least two vias;

patterning and etching at least two cone-shaped microprobes from said second metal layer;

patterning and etching a trench in said first metal layer electrically insulating said at least two cone-shaped microprobes from each other; and etching away said insulating material layer from said top surface of said semiconducting substrate.

2. A method for forming a cantilever beam probe card on a semiconducting substrate according to claim 1 further comprising the step of bonding said at least two vias to a printed circuit board (PCB) or a ceramic substrate through solder bumps formed on said PCB or said ceramic substrate.

3. A method for forming a cantilever beam probe card on a semiconducting substrate according to claim 1 further comprising the step of etching away said insulating material layer by a wet etching process.

4. A method for forming a cantilever beam probe card on a semiconducting substrate according to claim 1 further comprising the step of patterning and etching said trench in said first metal layer by a dry etch or a wet etch process.

5. A method for forming a cantilever beam probe card on a semiconducting substrate according to claim 1 further comprising the step of patterning and etching said at least two cone-shaped microprobes by a dry etch or a wet etch process.

6. A method for forming a cantilever beam probe card on a semiconducting substrate according to claim 1 further comprising the step of filling said at least two via holes in said semiconducting substrate with a metal selected from the group consisting of Cu, Au and Ni.

7. A method for forming a cantilever beam probe card on a semiconducting substrate according to claim 1 further comprising the step of patterning and etching said at least two via holes in said semiconducting substrate by a dry etching process.

8. A method for forming a cantilever beam probe card on a semiconducting substrate according to claim 1 further comprising the step of depositing said second metal layer from a metal selected from the group consisting of Cr and Ni.

9. A method for forming a cantilever beam probe card on a semiconducting substrate according to claim 1 further comprising the step of depositing said second metal layer to a thickness between about 0.1 µm and about 2 µm.

10. A method for forming a cantilever beam probe card on a semiconducting substrate according to claim 1 further comprising the step of depositing said first metal layer from a metal selected from the group consisting of Cu, Al and alloys thereof.

11. A method for forming a cantilever beam probe card on a semiconducting substrate according to claim 1 further comprising the step of depositing said first metal layer to a thickness between about 0.1 µm and about 2 µm.

12. A method for forming a cantilever beam probe card on a semiconducting substrate according to claim 1 further comprising the step of depositing said insulating material layer from a material selected from the group consisting of silicon oxide, silicon nitride and silicon oxynitride.

13. A method for forming a cantilever beam probe card on a semiconducting substrate according to claim 1 further comprising the step of depositing said insulating material layer to a thickness between about 0.1 µm and about 2 µm.

* * * * *